(12) United States Patent
Wang et al.

(10) Patent No.: US 11,621,286 B2
(45) Date of Patent: Apr. 4, 2023

(54) DISPLAY PANEL AND DISPLAY DEVICE

(71) Applicant: Wuhan Tianma Micro-Electronics Co., Ltd., Wuhan (CN)

(72) Inventors: Yawei Wang, Wuhan (CN); Ding Zhang, Wuhan (CN); Huanxi Zhang, Wuhan (CN)

(73) Assignee: Wuhan Tianma Micro-Electronics Co., Ltd., Wuhan (CN)

( * ) Notice: Subject to any disclaimer, the term of this patent is extended or adjusted under 35 U.S.C. 154(b) by 7 days.

(21) Appl. No.: 17/738,337

(22) Filed: May 6, 2022

(65) Prior Publication Data

US 2022/0262831 A1 Aug. 18, 2022

Related U.S. Application Data

(63) Continuation of application No. 17/235,743, filed on Apr. 20, 2021, now Pat. No. 11,355,535.

(30) Foreign Application Priority Data

Dec. 28, 2020 (CN) .......................... 202011583548.5

(51) Int. Cl.
*H01L 27/146* (2006.01)
*G09G 3/32* (2016.01)
(52) U.S. Cl.
CPC ......... *H01L 27/14603* (2013.01); *G09G 3/32* (2013.01); *G09G 2300/0426* (2013.01); *G09G 2310/0267* (2013.01); *G09G 2310/0275* (2013.01)

(58) Field of Classification Search
CPC ........... H01L 27/14603; H01L 27/3276; H01L 27/326; G09G 3/32; G09G 2300/0426; G09G 2310/0275; G09G 2310/0267
See application file for complete search history.

(56) References Cited

U.S. PATENT DOCUMENTS

2016/0351107 A1* 12/2016 Chen ..................... G02F 1/1345
2017/0153671 A1* 6/2017 Yamazaki ........... H01L 51/5237
2018/0033831 A1* 2/2018 An ......................... G06F 3/044

FOREIGN PATENT DOCUMENTS

CN 107154407 A 9/2017

* cited by examiner

*Primary Examiner* — Andrew Sasinowski
(74) *Attorney, Agent, or Firm* — KDB Firm PLLC

(57) ABSTRACT

Provided are a display panel and a display device. The display panel includes a first display area and a second display area. The first display area at least partially surrounds the second display area, and the second display area is configured to provide a photosensitive element. The first display area and the second display area are each provided with multiple sub-pixels. Each of the multiple sub-pixels includes a pixel circuit and a light emitting element. In each of the first display area and the second display area, active layers of the pixel circuits of the sub-pixels in each column have discontinuity points. The discontinuity point is located between respective two adjacent sub-pixels in the same column, or is located within each sub-pixel.

30 Claims, 13 Drawing Sheets

DISPLAY PANEL AND DISPLAY DEVICE

CROSS-REFERENCE TO RELATED APPLICATION

The present application is a continuation of and claims benefit of priority to U.S. application Ser. No. 17/235,743 titled "DISPLAY PANEL AND DISPLAY DEVICE" and filed on Apr. 20, 2021, which claims priority to Chinese Patent Application No. 202011583548.5, filed on Dec. 28, 2020, which is hereby incorporated by reference in its entirety as through fully and completely set forth herein.

TECHNICAL FIELD

The present disclosure relates to the field of display technologies and, in particular, to a display panel and a display device.

BACKGROUND

With the development of a terminal with the large screen-to-body ratio, the peripheral bezel area of the display screen is getting narrower and narrower, and for example, a bezel-less display screen has appeared. However, optical components such as a front camera and an infrared sensor still need to be integrated on the display screen, so a space needs to be provided on the upper side of the display screen to place the optical components, so as to achieve the functions of the optical components in the display device. However, the area where the optical components are disposed cannot be used for displaying. Thus, a concept of "full screen" is put forward. To achieve the full-screen display, a current design is to hide the optical components such as the camera under the screen. Ambient light can be incident on the optical components hidden under the screen, so the optical components such as the camera hidden under the screen can achieve the functions such as camera shooting, and the area is also provided with pixels so that this area can also be used for displaying, thus achieving the full-screen display.

SUMMARY

The present disclosure provides a display panel and a display device, which can avoid the problem of screen split in the display panel.

In a first aspect, the present disclosure provides a display panel. The display panel includes a first display area and a second display area.

The first display area at least partially surrounds the second display area, and the second display area is configured to provide a photosensitive element.

The first display area and the second display area are each provided with multiple sub-pixels. Each of the multiple sub-pixels includes a pixel circuit and a light emitting element.

In each of the first display area and the second display area, active layers of the pixel circuits of the sub-pixels in each column have discontinuity points. The discontinuity point is located between respective two adjacent sub-pixels in the same column, or is located within each sub-pixel.

In a second aspect, the present disclosure further provides a display device including the display panel described in the first aspect.

BRIEF DESCRIPTION OF DRAWINGS

Other features, objects and advantages of the present disclosure will become more apparent from a detailed description of non-restrictive embodiments with reference to the drawings.

DETAILED DESCRIPTION

The solutions of the present disclosure will be completely described below in conjunction with the specific embodiments and the drawings in the embodiments of the present disclosure. Apparently, the embodiments described herein are part, not all, of the embodiments of the present disclosure, and based on the embodiments of the present disclosure, all other embodiments obtained by those skilled in the art on the premise that no creative work is done are within the scope of the present disclosure.

Figure 1:
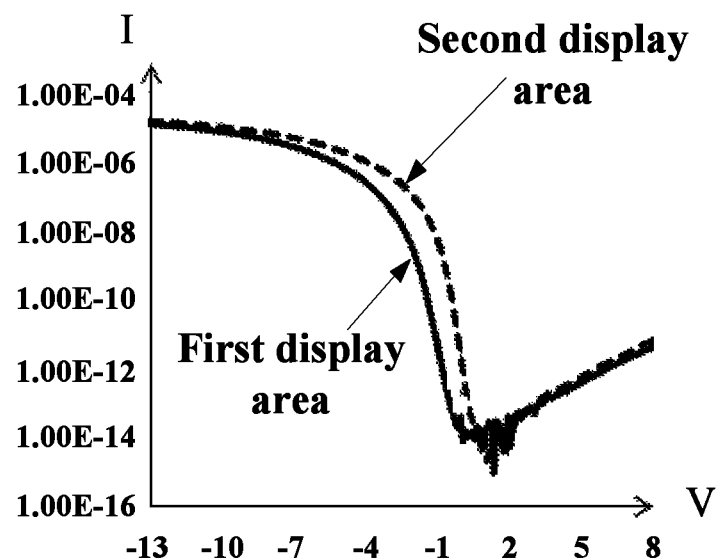
FIG. 1 is a graph of transistor IV characteristics of a first display area and a second display area in a display panel in the existing art.

The display panel in the existing art includes a first display area and a second display area. Since the second display area is a camera setting area, sub-pixels in the second display area are sparsely arranged, and a spacing between the sub-pixels is relatively large, so that ambient light can enter a camera disposed in the second display area through a gap between the sub-pixels, thereby achieving the image acquisition. The sub-pixels of the first display area are closely arranged, and along a column direction of the sub-pixels, continuous active layers are used for signal transmission in the first display area. Since the spacing between the sub-pixels in the second display area is relatively large, the active layers in the second display area are disconnected in the column direction to avoid a relatively large line resistance generated by the continuous active layers in the column direction. FIG. 1 is a graph of transistor IV characteristics of a first display area and a second display area in a display panel in the existing art. As shown in FIG. 1, since the active layers in the second display area are disconnected in the column direction and the active layers in the first display area are continuous in the column direction, there is a large difference in IV characteristic between the transistors of the pixel circuits of the first display area and the second display area. Since the IV characteristics of the transistors of the pixel circuits in the first display area and the second display area are different, the sub-pixels in the first display area and the second display area have different luminous values when driven by the same data voltage, resulting in obvious screen split in the first display area and the second display area.

Figure 2:
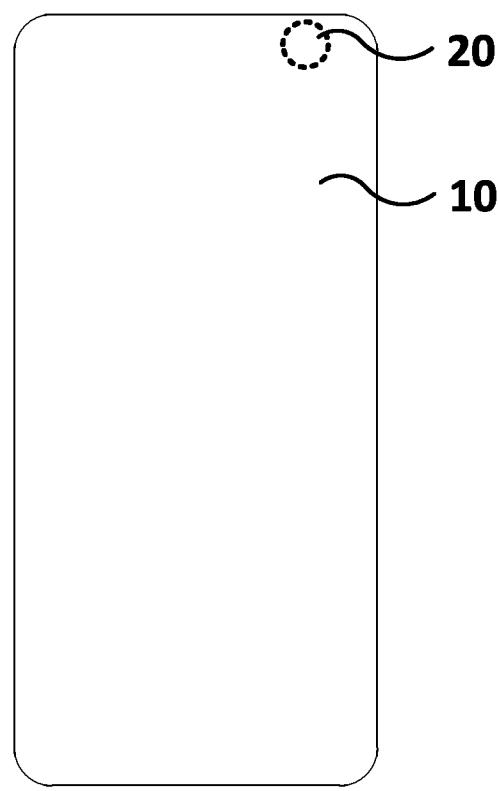
FIG. 2 is a structural diagram of a display panel provided by an embodiment of the present disclosure.

In view of the above, an embodiment of the present disclosure provides a display panel. FIG. 2 is a structural view of a display panel provided by an embodiment of the present disclosure. As shown in FIG. 2, the display panel provided by the embodiment of the present disclosure includes a first display area 10 and a second display area 20. The first display area 10 at least partially surrounds the second display area 20, and the second display area 20 is configured to provide a photosensitive element, such as a camera. Both the first display area 10 and the second display area 20 can be used for displaying. The first display area 10 and the second display area 20 are each provided with multiple sub-pixels. Each sub-pixel includes a pixel circuit and a light emitting element. In each of the first display area 10 and the second display area 20, active layers of the pixel circuits of the sub-pixels in each column have discontinuity points. The discontinuity point is located between two adjacent sub-pixels in the same column, or is located within each sub-pixel.

Since the active layers of the sub-pixels in each column have discontinuity points in each of the first display area and the second display area, the differences in pixel circuit transistor characteristics of the sub-pixels of the first display area and the second display area can be reduced, so that the sub-pixel display effect of the first display area and the second display area tends to be uniform, thereby avoiding the screen split in the first display area and the second display area.

Optionally, the discontinuity point in the first display area has a same position as the discontinuity point in the second display area. According to the embodiment of the present disclosure, the discontinuity point in the first display area has the same position as the discontinuity point in the second display, so that the uneven display problem caused by the difference between the design of the active layers in the first display area and the design of the active layers in the second display area can be reduced as much as possible. For example, it can be configured that each of the discontinuity points of the active layers of the pixel circuits of the sub-pixels in each column in the first display area is located between respective two adjacent ones of the sub-pixels in the each column, and each of the discontinuity points of the active layers of the pixel circuits of the sub-pixels in each column in the second display area is located between respective two adjacent ones of the sub-pixels in the each column. Alternatively, each of the discontinuity points of the active layers of the pixel circuits of the sub-pixels in each column in the first display area is located within a respective one of the sub-pixels in the each column, and each of the discontinuity points of the active layers of the pixel circuits of the sub-pixels in each column in the second display area is located within a respective one of the sub-pixels in the each column.

Alternatively, in the display panel provided by the embodiment of the present disclosure, the active layer may be a polycrystalline silicon material, a metal oxide material, an amorphous silicon material or the like. The active layer material is not specifically limited in the embodiment of the present disclosure. For the active layer material with a larger carrier mobility, when the active layers of the first display area have no discontinuity point in the column direction of the sub-pixels and the active layers of the second display area have discontinuity points in the column direction of the sub-pixels, the difference in transistor characteristics is relatively large. Therefore, when the active layer adopts a material with a larger carrier mobility such as the polycrystalline silicon, the screen split phenomenon of the first display area and the second display area has been improved apparently in the embodiment of the present disclosure.

Figure 3:
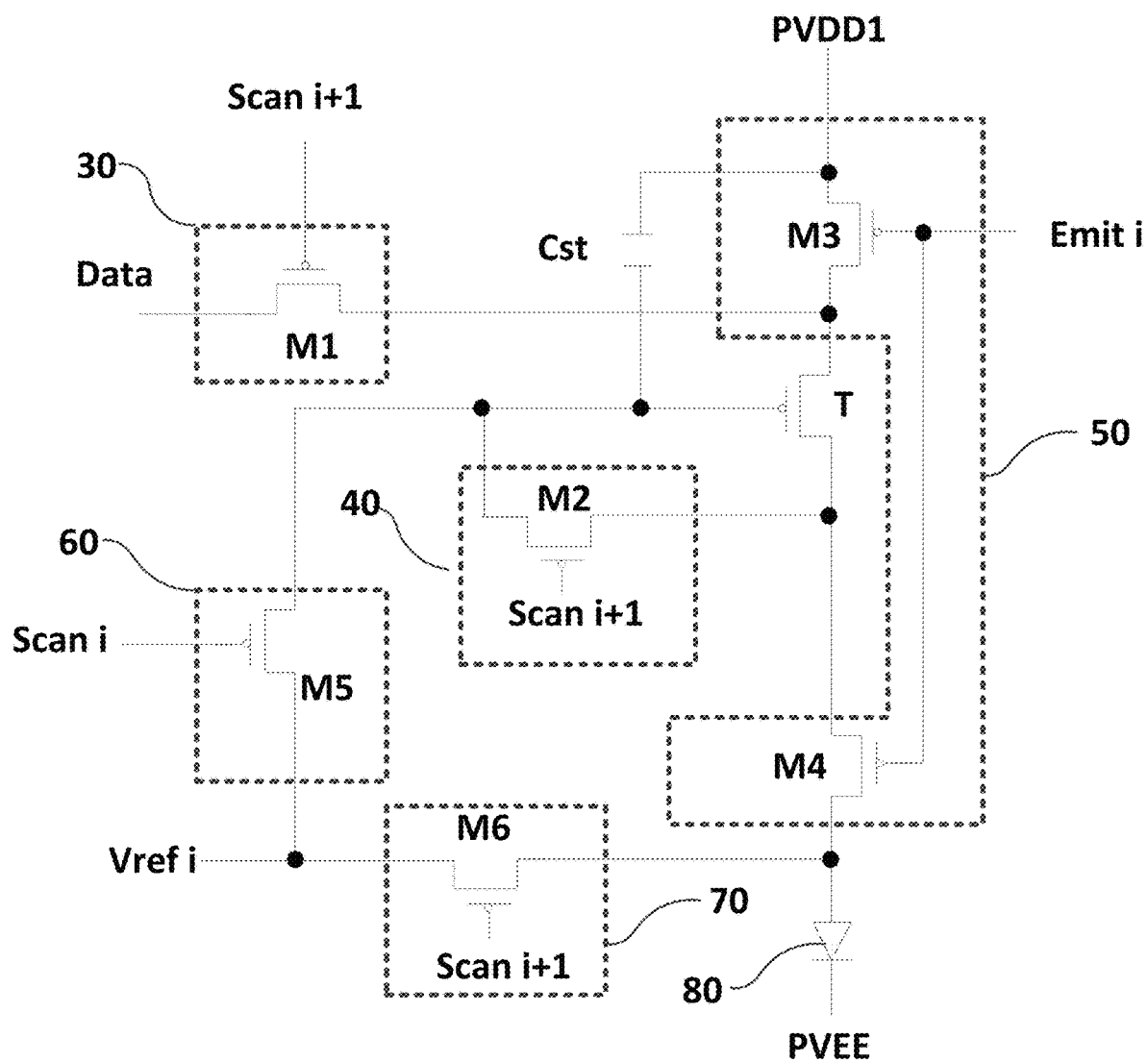
FIG. 3 is a schematic diagram of a pixel circuit provided by an embodiment of the present disclosure.

FIG. 3 is a schematic diagram of a pixel circuit provided by an embodiment of the present disclosure. As shown in FIG. 3, the pixel circuit includes, in part, a drive transistor T, a data write module 30, a threshold compensation module 40, a light emission control module 50, a first reset module 60 and a second reset module 70. The data write modules 30 is configured to provide a data signal for the drive transistor. The light emission control module 50 is connected in series to the drive transistor T and the light-emitting element 80 separately, and the light emission control module 50 is configured to control whether a drive current flows through the light emitting element 80. The threshold compensation module 40 is used for detecting and self-compensating an offset of a threshold voltage of the drive transistor T. The first reset module 60 is connected to a control end of the drive transistor T and is configured to reset the control end of the drive transistor T. The second reset module 70 is electrically connected to the light emitting element 80 and is configured to reset the light emitting element 80.

Optionally, the data write module 30 includes a first transistor M1. The threshold compensation module 40 includes a second transistor M2. The light emission control module 50 includes a third transistor M3 and a fourth transistor M4. The first reset module 60 includes a fifth transistor M5, and the second reset module 70 includes a sixth transistor M6. A first end of the drive transistor T is electrically connected to a second end of the first transistor M1. A first end of the first transistor M1 is electrically connected to a data line. A first end of the second transistor M2 is electrically connected to a second end of the drive transistor T, and a second end of the second transistor M2 is electrically connected to the control end of the drive transistor T. A first end of the fifth transistor M5 is electrically connected to a reset signal line Vref, and a second end of the fifth transistor M5 is electrically connected to the control end of the drive transistor T. A first end of the third transistor M3 is electrically connected to a first positive power supply signal line PVDD1, a second end of the third transistor M3 is electrically connected to the first end of the drive transistor T, and a control end of the third transistor M3 is electrically connected to a light emission control signal line Emit i. A first end of the fourth transistor M4 is electrically connected to the second end of the drive transistor T, and a second end of the fourth transistor M4 is electrically connected to an anode of the light emitting element 80. A first end of the sixth transistor M6 is electrically connected to the reset signal line Vref, and a second end of the sixth transistor M6 is electrically connected to the anode of the light emitting element 80. As shown in FIG. 3, the pixel circuit further includes a storage capacitor Cst, where a first electrode plate of the storage capacitor Cst is electrically connected to the first positive power supply signal line PVDD1, and a second electrode plate of the storage capacitor Cst is electrically connected to the control end of the drive transistor T. Exemplarily, a control end of the fifth transistor M5 is electrically connected to a scanning line Scan i, a control end of the second transistor M2 is electrically connected to a scanning line Scan (i+1), a control end of the fourth transistor M4 is electrically connected to the light emission control signal line Emit i, and a control end of the sixth transistor M6 is electrically connected to a second scanning line Scan (i+1), where i is a positive integer.

It is to be noted that FIG. 3 exemplarily provides a schematic diagram of optional functional modules of a pixel circuit and a structural diagram of optional internal components of the pixel circuit, which is not limited by the embodiment of the present disclosure. For example, the pixel circuit shown in FIG. 3 includes seven transistors and one capacitor. In other embodiments, the composition and connection mode of the internal components of the pixel circuit may be adjusted according to the actual requirements of the display panel, and the functional modules and connection relationships in FIG. 3 can be increased, decreased and replaced according to the functional requirements of the pixel circuit.

After the active layers are provided with a discontinuity point, a metal line, a via and the like may be subsequently provided to connect the active layers at the discontinuity for signal transmission. In this case, if the discontinuity point is too close to the drive transistor, subsequent processing for the metal line, the via and the like will affect the stability of the drive transistor. Therefore, to prevent the discontinuity point of the active layers from affecting the stability of the drive transistor, the discontinuity point is provided to be as far as possible from the drive transistor in the embodiment of the present disclosure. For example, the distance between the discontinuity point and the drive transistor is provided to be greater than 5 um.

According to the layout design of respective components in the pixel circuit and the requirement of the distance between the discontinuity point and the drive transistor, a position of the discontinuity point may be selected. For example, referring to FIG. 3, the discontinuity point is disposed between the first reset module 60 (e.g., including the fifth transistor M5) and the threshold compensation module 40 (e.g., including the second transistor M2), between the threshold compensation module 40 (e.g., including the second transistor M2) and the light emission control module 50 (e.g., including the fourth transistor M4), or between the second reset module 70 (e.g., including the sixth transistor M6) and the light emission control module 50 (e.g., including the fourth transistor M4); or the discontinuity point is disposed between the second reset module 70 (e.g., including the sixth transistor M6) of a sub-pixel in an i-th row and the first reset module 60 (e.g., including the fifth transistor M5) of a sub-pixel in an (i+1)-th row. In the following, the pixel circuit is described by using the circuit structure shown in FIG. 3 as an example.

Figure 4:
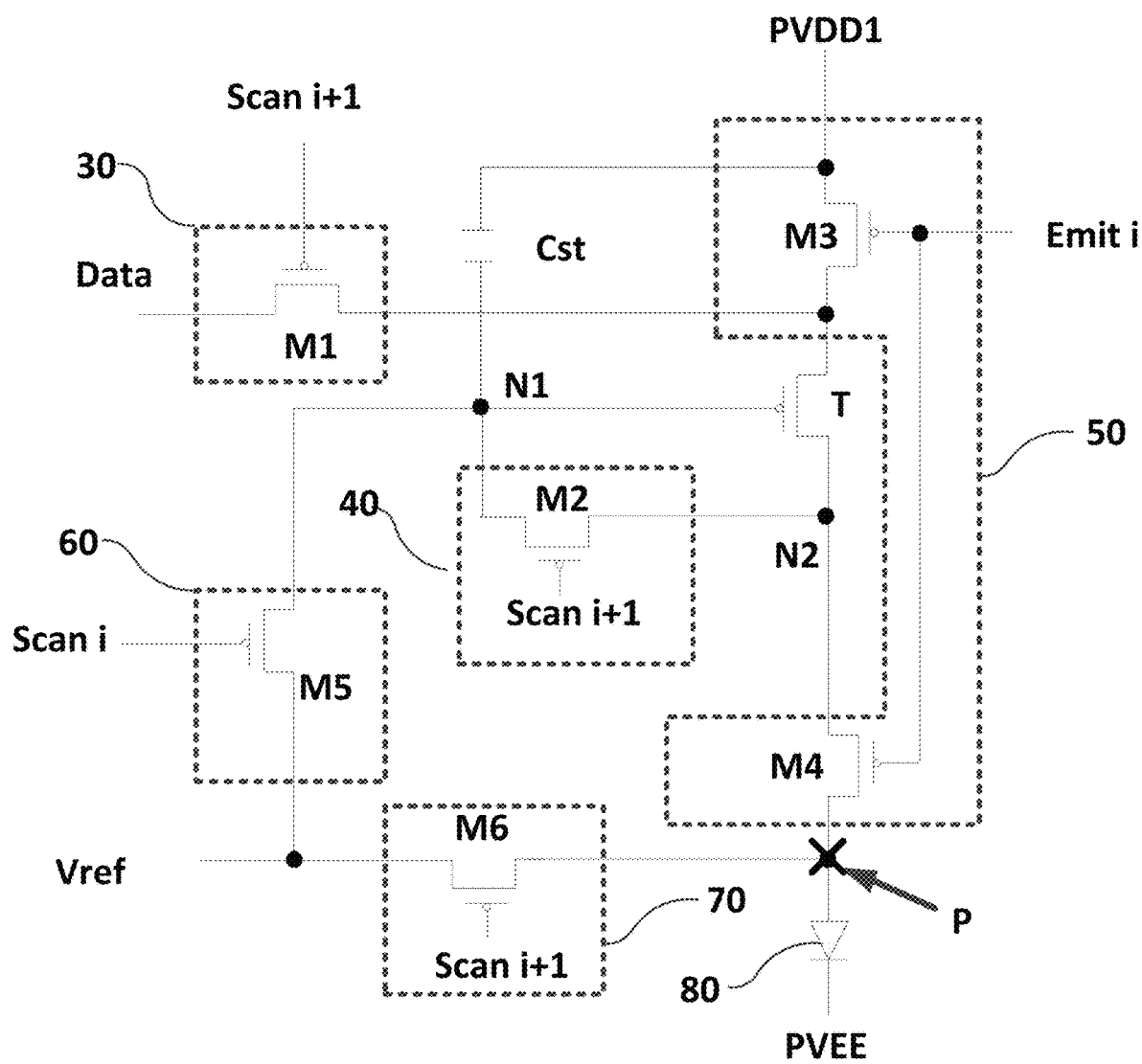
FIG. 4 is a schematic diagram of a discontinuity point setting position provided by an embodiment of the present disclosure.
Figure 5:
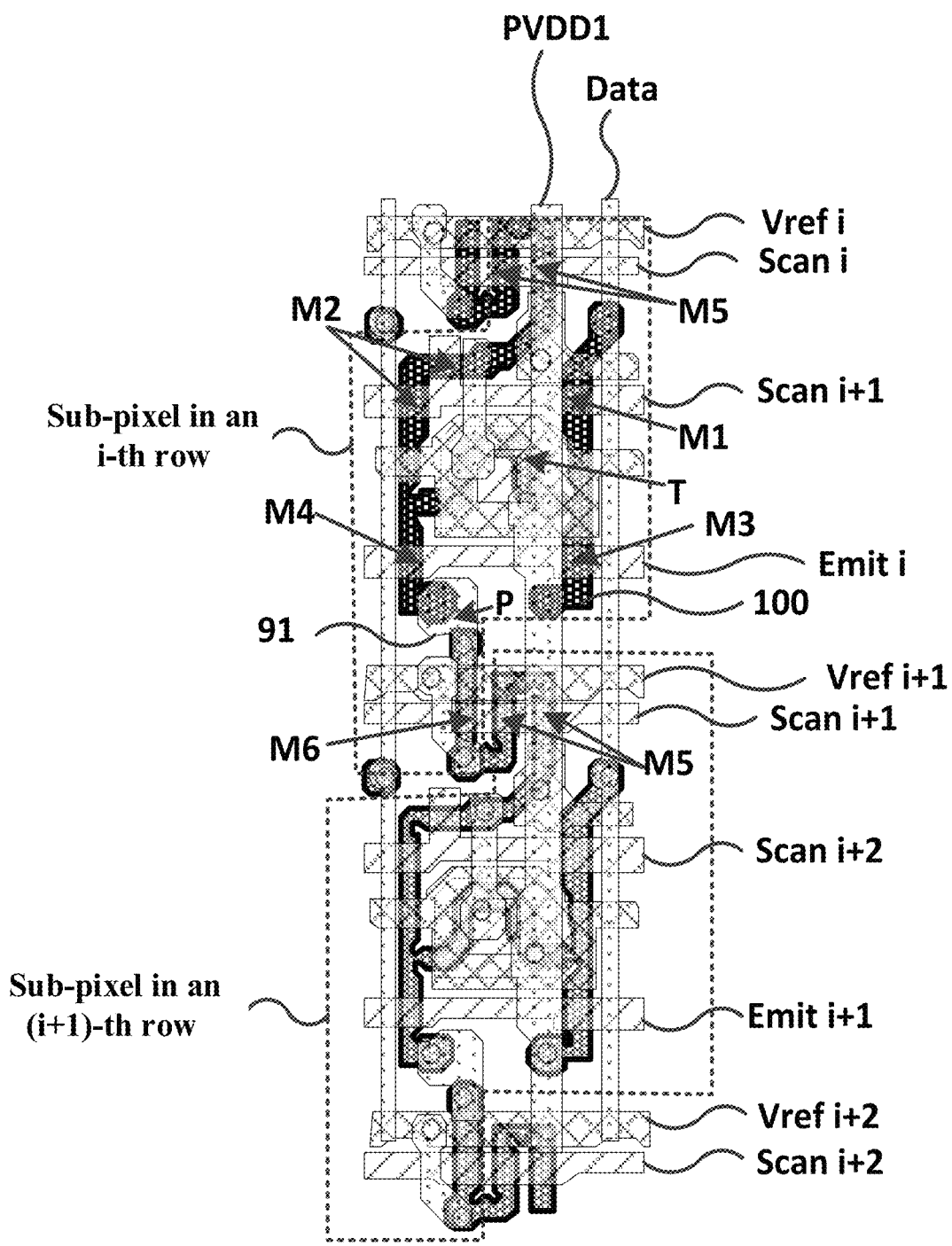
FIG. 5 is a layout diagram of a pixel circuit in a first display area.
Figure 6:
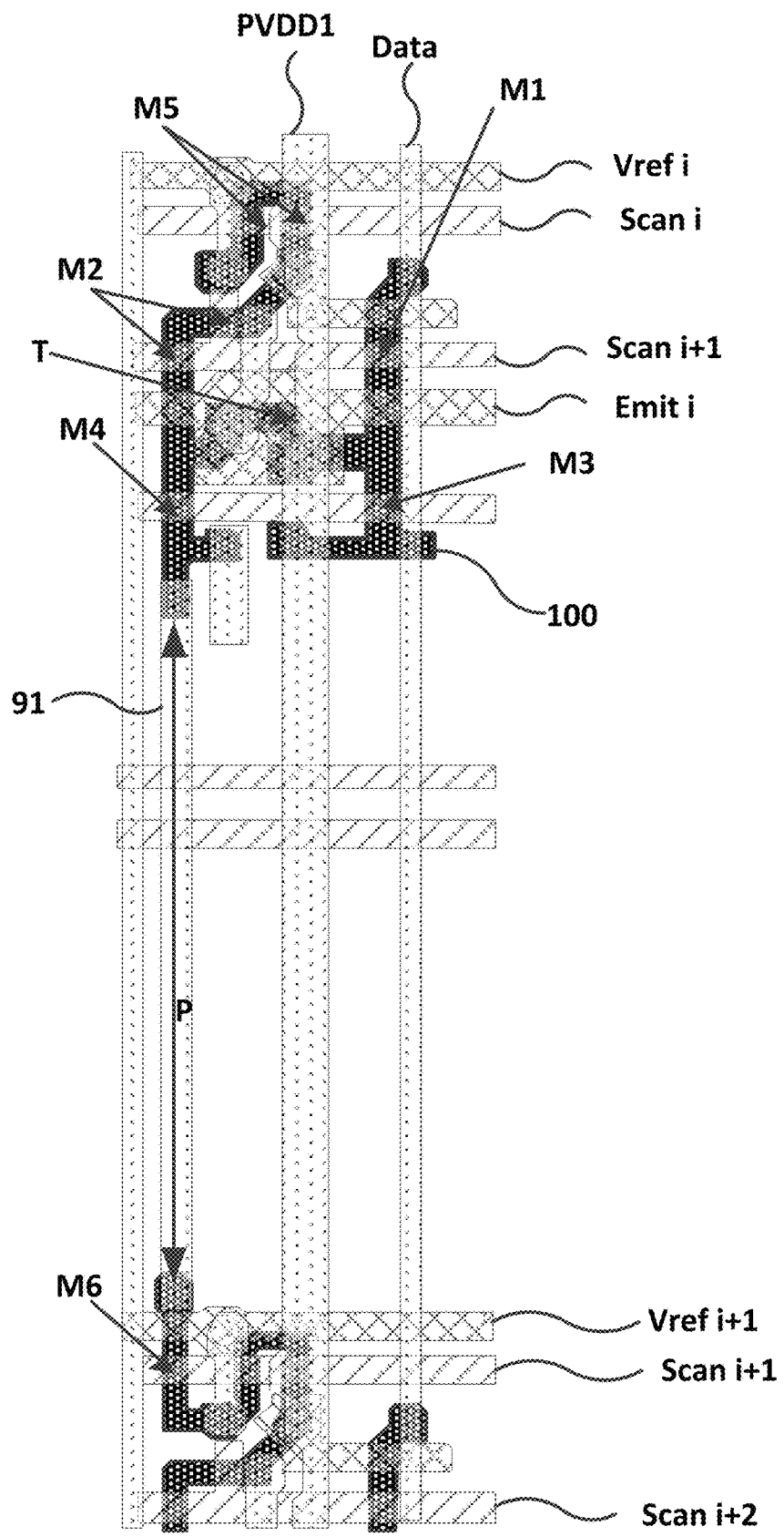
FIG. 6 is a layout diagram of a pixel circuit in a second display area.
Figure 7:
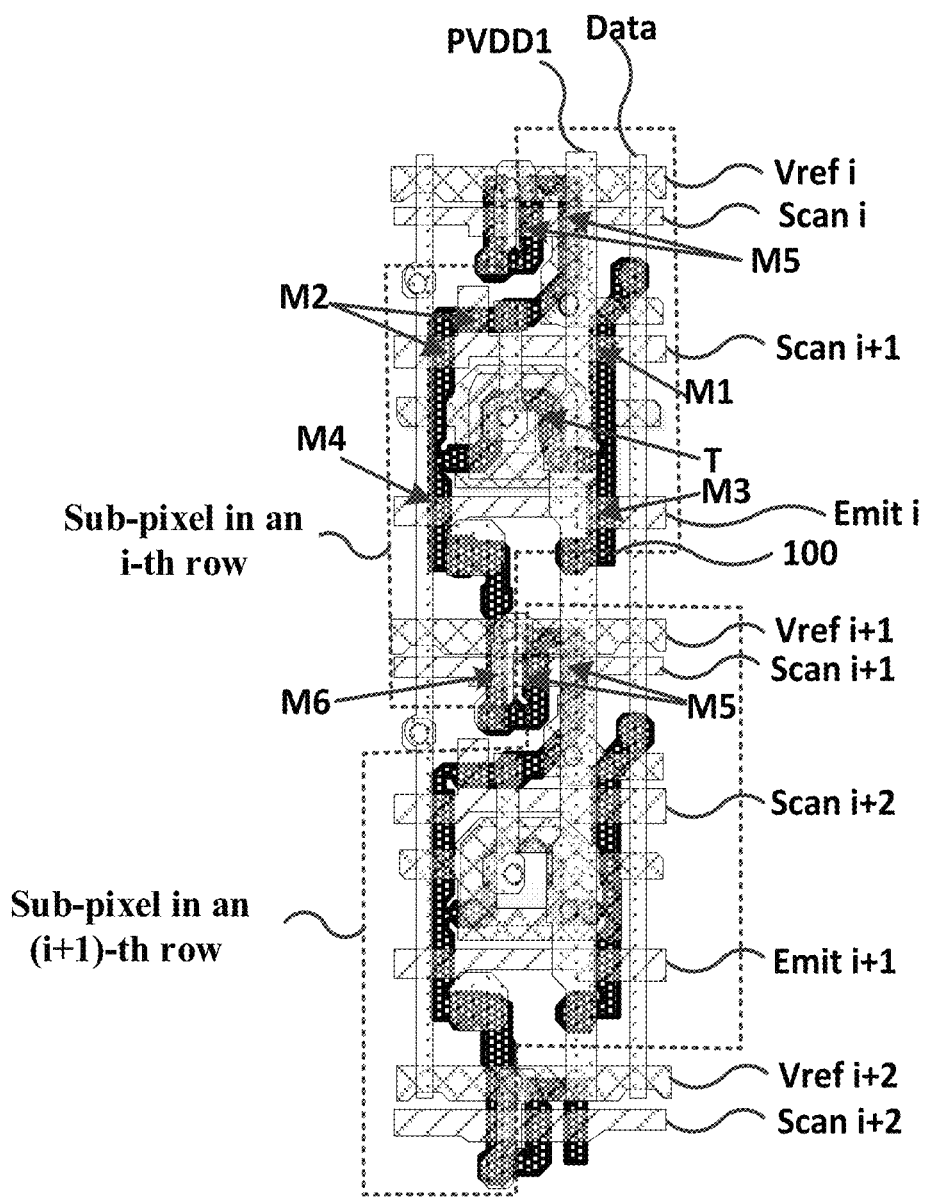
FIG. 7 is a layout diagram of a pixel circuit in a first display area, as known in the prior art.
Figure 8:
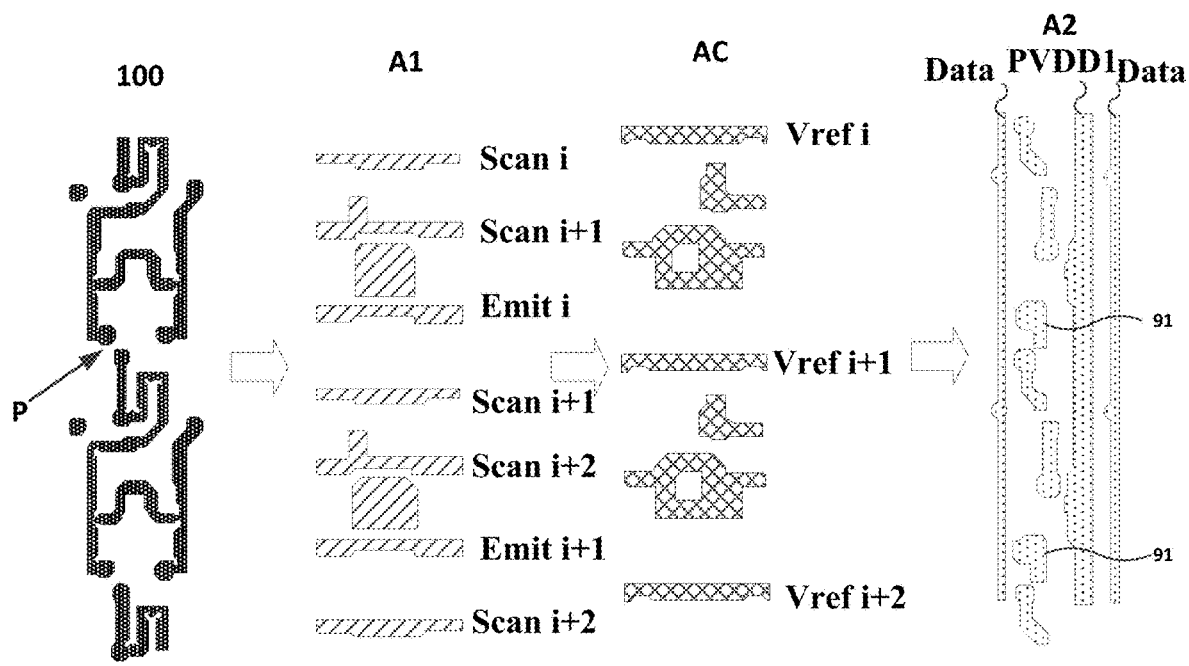
FIG. 8 illustrates layer-by-layer layouts of films of a pixel circuit film in a first display area.
Figure 9:
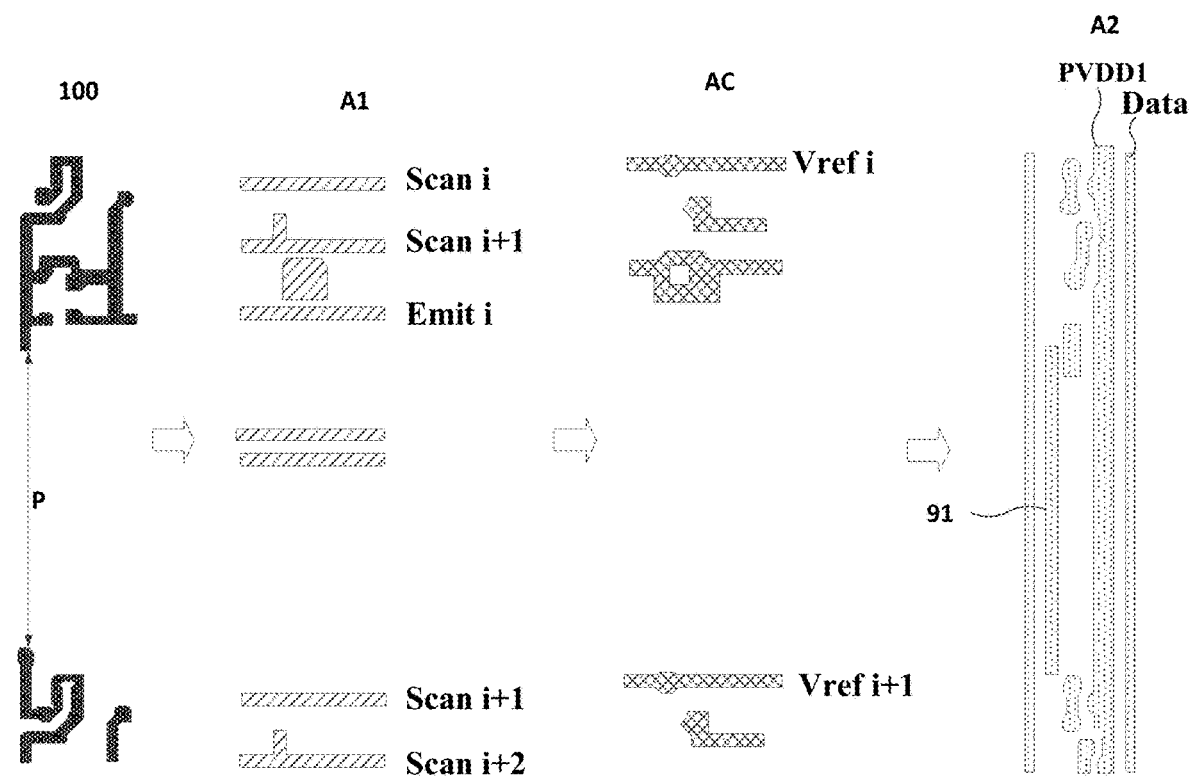
FIG. 9 illustrates layer-by-layer layouts of films of a pixel circuit film in a second display area.

FIG. 4 is a schematic diagram of a discontinuity point setting position provided by an embodiment of the present disclosure. FIG. 4 describes by using the circuit structure and the connection relationship shown in FIG. 3 as an example. As shown in FIG. 4, the active layer of each sub-pixel is provided with a discontinuity point P between the second reset module 70 and the light emission control module 50. The active layer of the second reset module 70 is electrically connected to the active layer of the light emission control module 50 through a first metal line (not shown in FIG. 4). FIG. 5 is a layout diagram of a pixel circuit in a first display area. FIG. 6 is a layout diagram of a pixel circuit in a second display area. FIG. 7 is a layout diagram of a pixel circuit in a first display area, as known in the prior art. To show the layout structure of the pixel circuit more clearly, FIG. 8 illustrates layer-by-layer layouts of films of a pixel circuit in a first display area, and FIG. 9 illustrates layer-by-layer layouts of films of a pixel circuit in a second display area.

It is to be noted that the layout structure of the pixel circuit is described by using the structure of modules of the pixel circuit shown in FIG. 3 as an example.

As shown in FIG. 7, the active layer is represented by 100. As seen from the prior art FIG. 7, in the first display area, the active layer of the second reset module (the sixth transistor M6) is provided to be continuous with the active layer of the light emission control module (the fourth transistor M4). The light emitting element (not shown in the figure) is connected between the continuous active layers of the second reset module (the sixth transistor M6) and the light emission control module (the fourth transistor M4), thereby achieving signal transmission between the light emission control module and the light emitting element and signal transmission between the second reset module and the light emitting element. Referring to FIGS. 5, 6, 8, and 9 concurrently, the active layer 100 of each sub-pixel in the first display area and the second display area is disconnected between the second reset module (the sixth transistor M6) and the light emission control module (the fourth transistor M4) to form a discontinuity point.

As shown in FIGS. 5 and 6, in the embodiment of the present disclosure, the discontinuity point is disposed in the active layer between the second reset module (the sixth transistor M6) and the light emission control module (the fourth transistor M4) each sub-pixel, and to implement the normal signal transmission, the active layer of the second reset module and the active layer of the light emission control module are electrically connected at the discontinuity point through the first metal line 91. In other words, first metal line 91 provides electrical connection between the active layer of the second reset module and the active layer of the light emission control module.

Optionally, the display panel includes a substrate and a reset signal line layer. The reset signal line layer is located on a side of the active layer facing away from the substrate. The reset signal line layer includes multiple reset signal lines. The second reset module of each of sub-pixels in an i-th row and the first reset module of a respective one of sub-pixels in an (i+1)-th row are electrically connected to a same reset signal line, where i is a positive integer. As shown in FIGS. 5 and 6, the second reset module (the sixth transistor M6) of the sub-pixel in the i-th row and the first reset module (the fifth transistor M5) of the sub-pixel in the (i+1)-th row are electrically connected to the same reset signal line. If the second reset module includes the sixth transistor M6 and the first reset module includes the fifth transistor M5, then the sixth transistor M6 of the sub-pixel in the i-th row and the fifth transistor M5 of the sub-pixel in the (i+1)-th row are electrically connected to the same reset signal line Vref (i+1). The reset signal line Vref (i+1) supplies a reset signal to the sixth transistor M6 of the sub-pixel in the i-th row and the fifth transistor M5 of the sub-pixel in the (i+1)-th row. Since a reset signal provided by the first reset module (the fifth transistor M5) for a control end of the drive transistor T is the same as a reset signal provided by the second reset module (the sixth transistor M6) for an anode of the light emitting element, the sixth transistor M60 of the sub-pixel in the i-th row and the fifth transistor M5 of the sub-pixel in the (i+1)-th row may be provided to be electrically connected to the same reset signal line Vref (i+1), thereby reducing the number of reset signal lines in the display panel.

Optionally, referring to FIGS. 8 and 9, the display panel includes a first metal layer A1 for forming a scan line Scan and a light emission control signal line Emit of the display panel.

Optionally, referring to FIGS. 8 and 9, the display panel further includes a second metal layer A2. The second metal layer A2 is located on a side of the reset signal line layer AC facing away from the substrate. An insulating layer is disposed between the reset signal line layer AC and the second metal layer A2 to achieve electrical insulation. The second metal layer AC includes multiple data lines Data and the first metal line 91. As shown in FIGS. 5, 6, 8, and 9, the data lines Data and the first metal line 91 are located on the same layer and formed by using the second metal layer A2. The embodiment of the present disclosure uses the second metal layer A2 to prepare and form the data line Data and the first metal line 91 simultaneously, and the active layer of the second reset module is electrically connected to the active layer of the light emission control module at the discontinuity point through the first metal line 91, without providing an additional metal film for the first metal line 91, so that the number of processes can be reduced.

Optionally, the display panel includes a second metal layer and a third metal layer. The second metal layer is located on a side of the reset signal line layer facing away from the substrate. The third metal layer is located on a side of the second metal layer facing away from the substrate. An insulating layer is disposed between the second metal layer and the third metal layer to achieve the electrical insulation. The second metal layer includes multiple data lines Data and multiple first positive power supply signal lines PVDD1. The third metal layer includes multiple second positive power supply signal lines and the first metal line. The multiple second positive power supply signal lines are electrically connected to the multiple first positive power supply signal lines. That is, in a direction facing away from the substrate, the display panel is sequentially provided with the active layer, the first metal layer, the second metal layer, the insulating layer, and the third metal layer. Multiple second positive power signal lines and the first metal line are formed by using the third metal layer. The second metal layer includes multiple data lines and multiple first positive power supply signal lines. The first positive power supply signal line is used for providing a positive power supply signal for the pixel circuit, and the data line Data is used for providing a data signal for the pixel circuit. The third metal layer includes multiple second positive power signal lines and the first metal line. Since it is necessary to supply a positive power supply signal to the pixel circuit of each sub-pixel in the display panel, but the first positive power signal line has a line resistance, it is possible that there is a difference among positive power supply signals received by the sub-pixels at different positions, thereby affecting the display effect. Therefore, in the display panel in the embodiment of the present disclosure, a second positive power supply signal line is formed through the third metal layer, is electrically connected to the first positive power supply signal line, and is also used for supplying a positive power supply signal to the pixel circuit. The second positive power supply signal lines and the first positive power supply signals are equivalently connected in parallel so that when the positive power supply signal is supplied to the pixel circuit, the line resistance can be reduced to a certain extent. In the embodiment of the present disclosure, the second power supply signal lines and the first metal line are formed through the third metal layer in a same process, without configuring an additional metal film for the first metal line, so that the number of processes can also be reduced.

Figure 10:
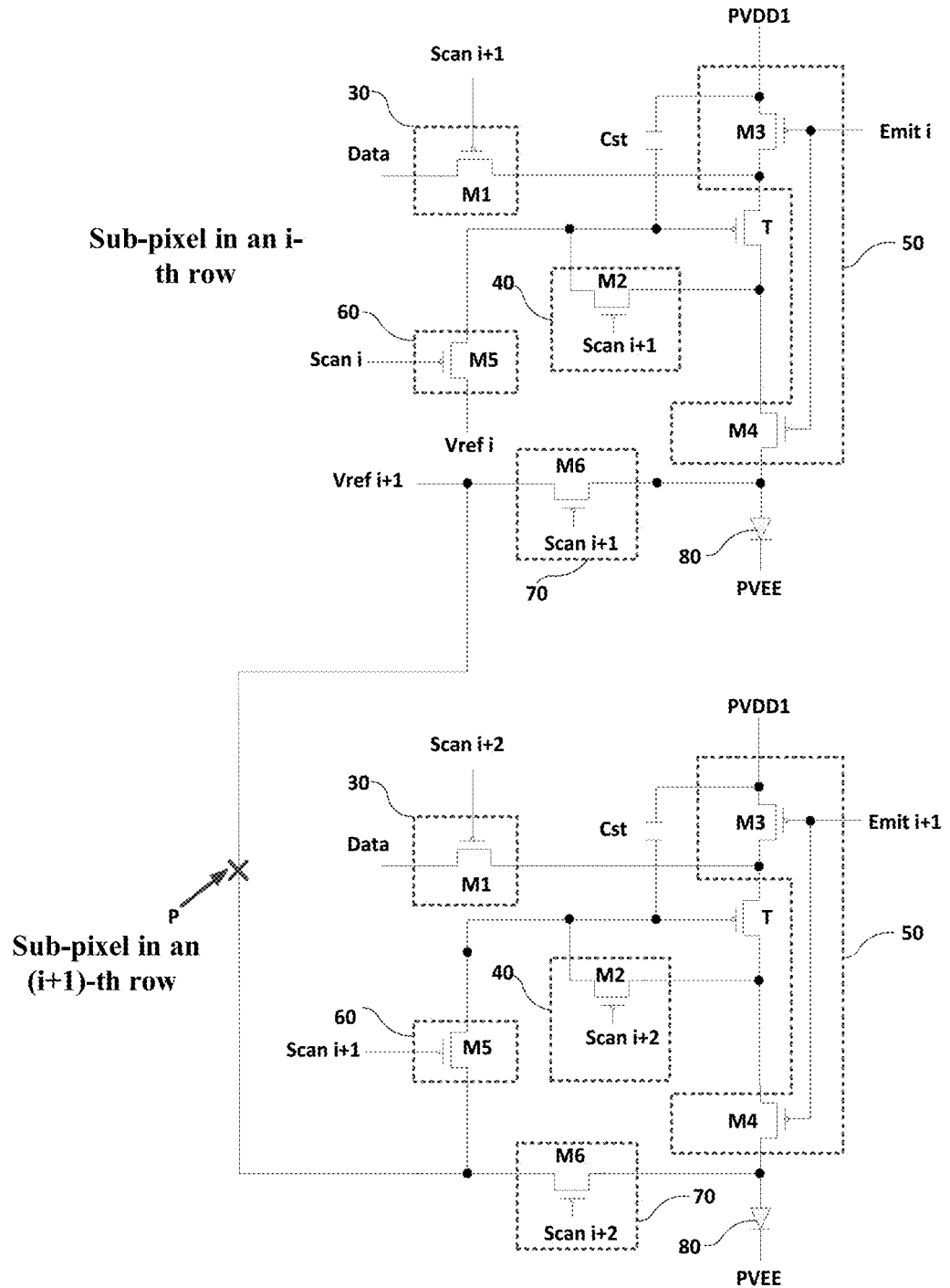
FIG. 10 is a schematic diagram of another discontinuity point setting position provided by an embodiment of the present disclosure.

Optionally, in a same column, active layers of the sub-pixel in the i-th row and the sub-pixel in the (i+1)-th row are provided with a discontinuity point at a junction of the second reset module of the sub-pixel in the i-th row and the first reset module of the sub-pixel in the (i+1)-th row, where i is a positive integer. FIG. 10 is a schematic diagram of another discontinuity point setting position provided by an embodiment of the present disclosure. FIG. 10 illustrates by using the circuit structure and the connection relationship shown in FIG. 3 as an example. As shown in FIG. 10, in the same column, active layers of the sub-pixel in an i-th row and the sub-pixel in an (i+1)-th row are provided with a discontinuity point P between the second reset module 70 of the sub-pixel in the i-th row and the first reset module 60 of the sub-pixel in the (i+1)-th row.

Figure 11:
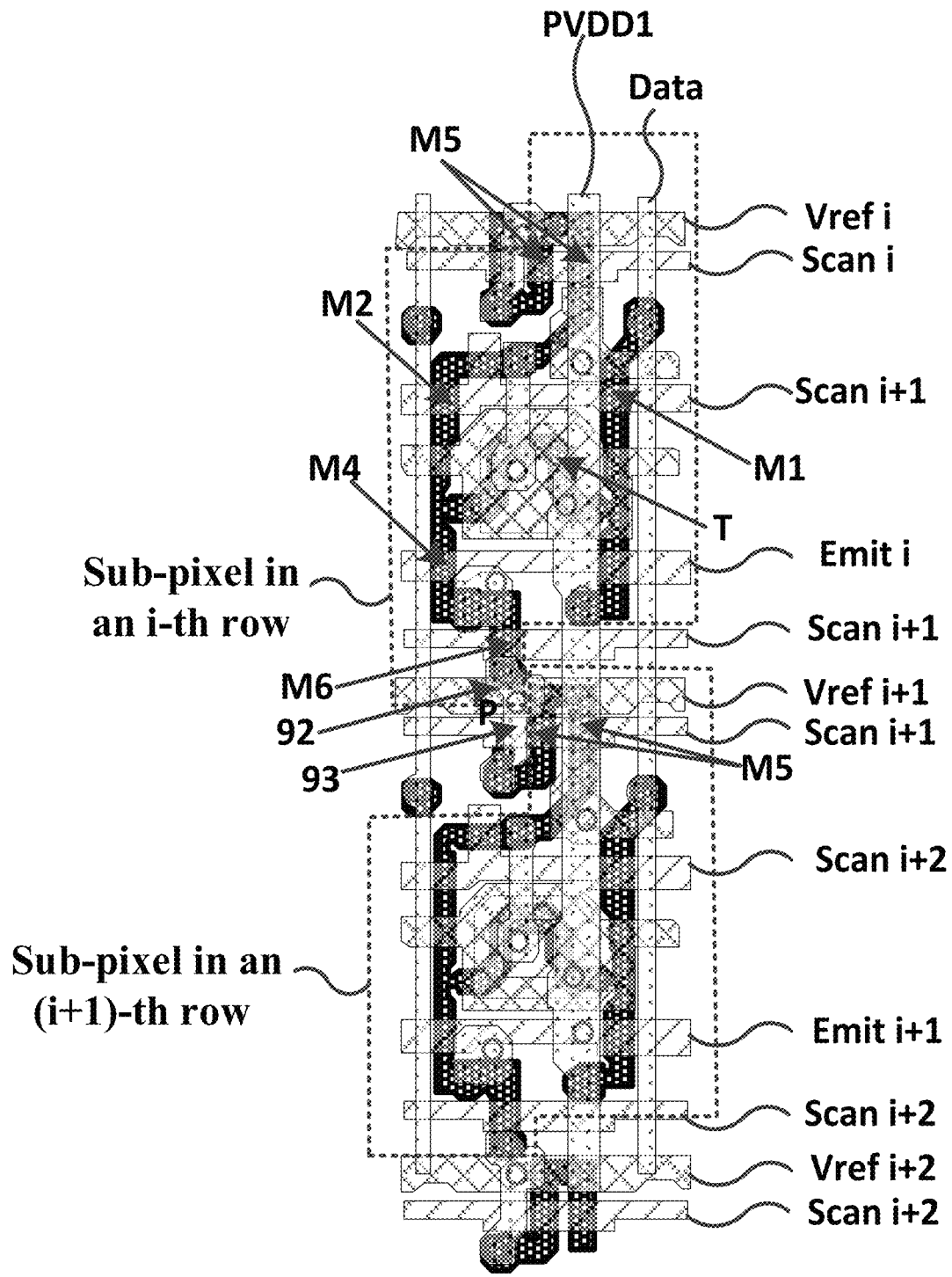
FIG. 11 is a layout diagram of a pixel circuit of another first display panel provided by an embodiment of the present disclosure.
Figure 12:
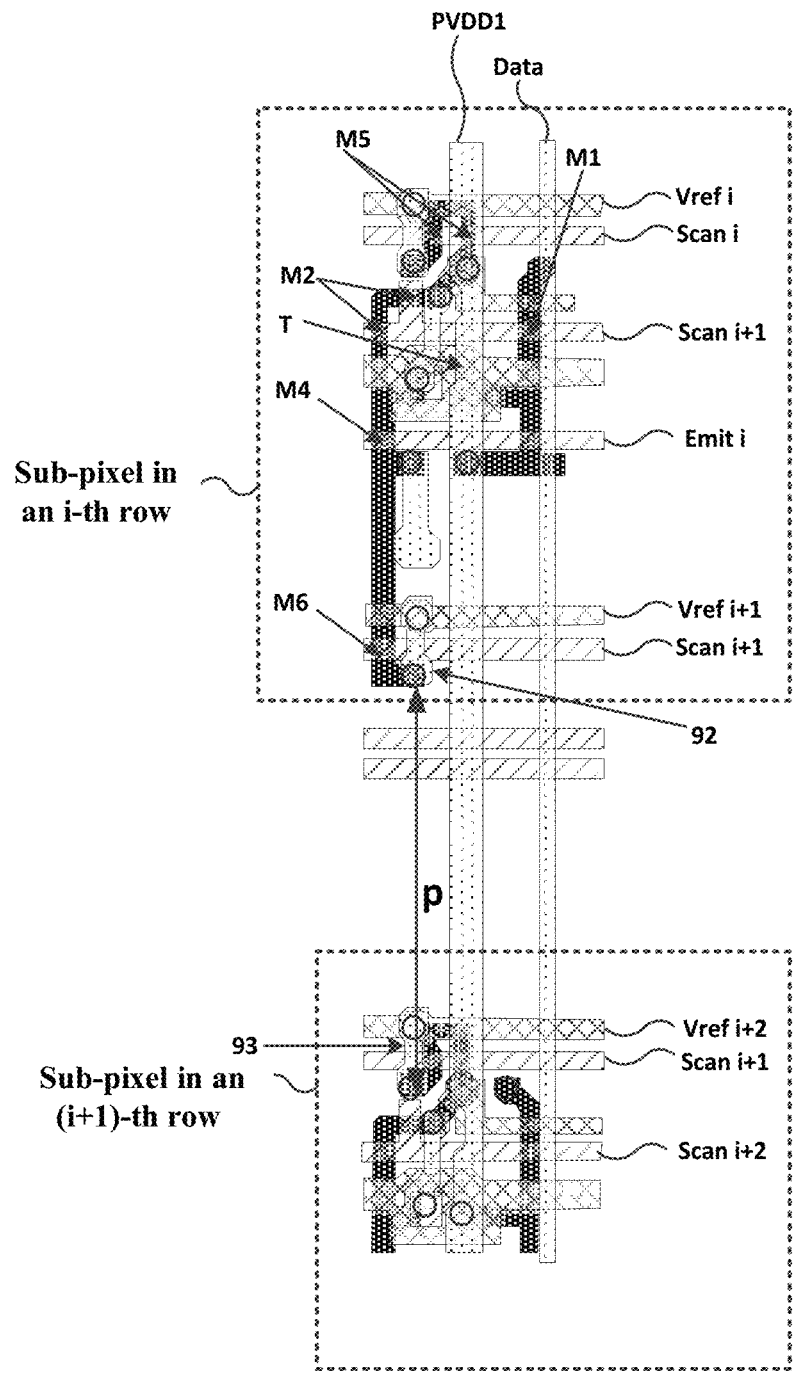
FIG. 12 is a layout diagram of a pixel circuit of another second display panel provided by an embodiment of the present disclosure.
Figure 13:
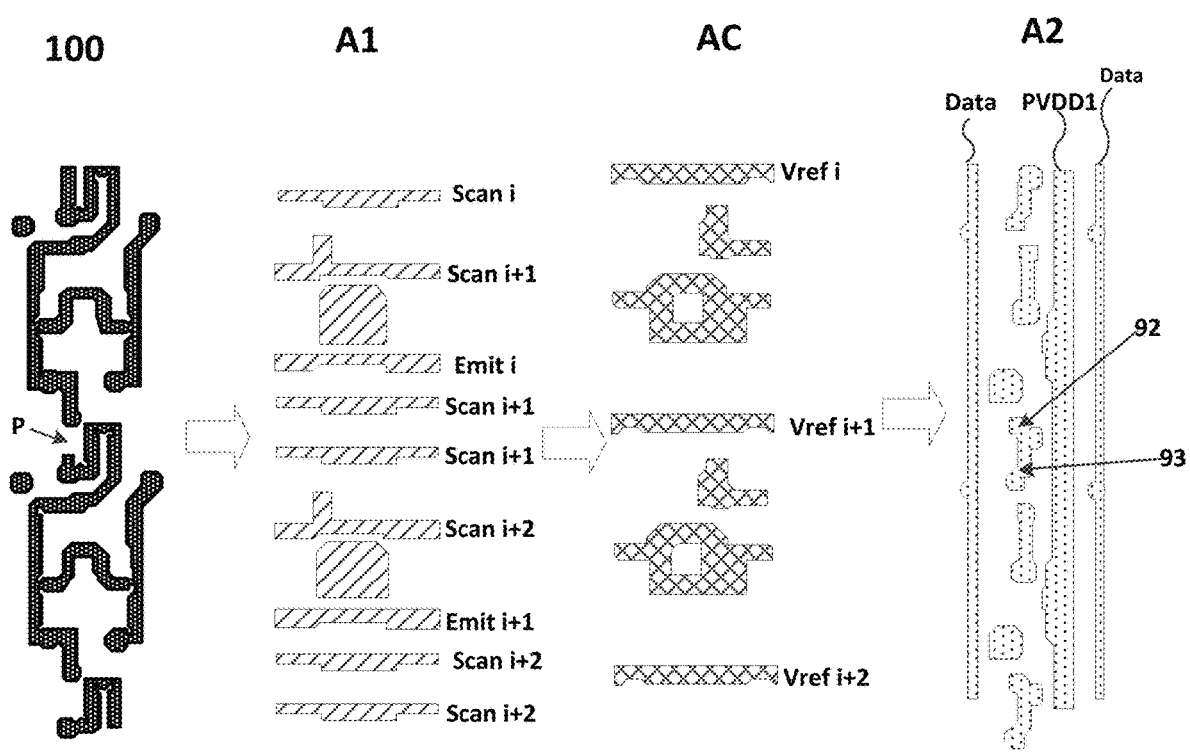
FIG. 13 illustrates layer-by-layer layouts of films of the pixel circuit in FIG. 11.
Figure 14:
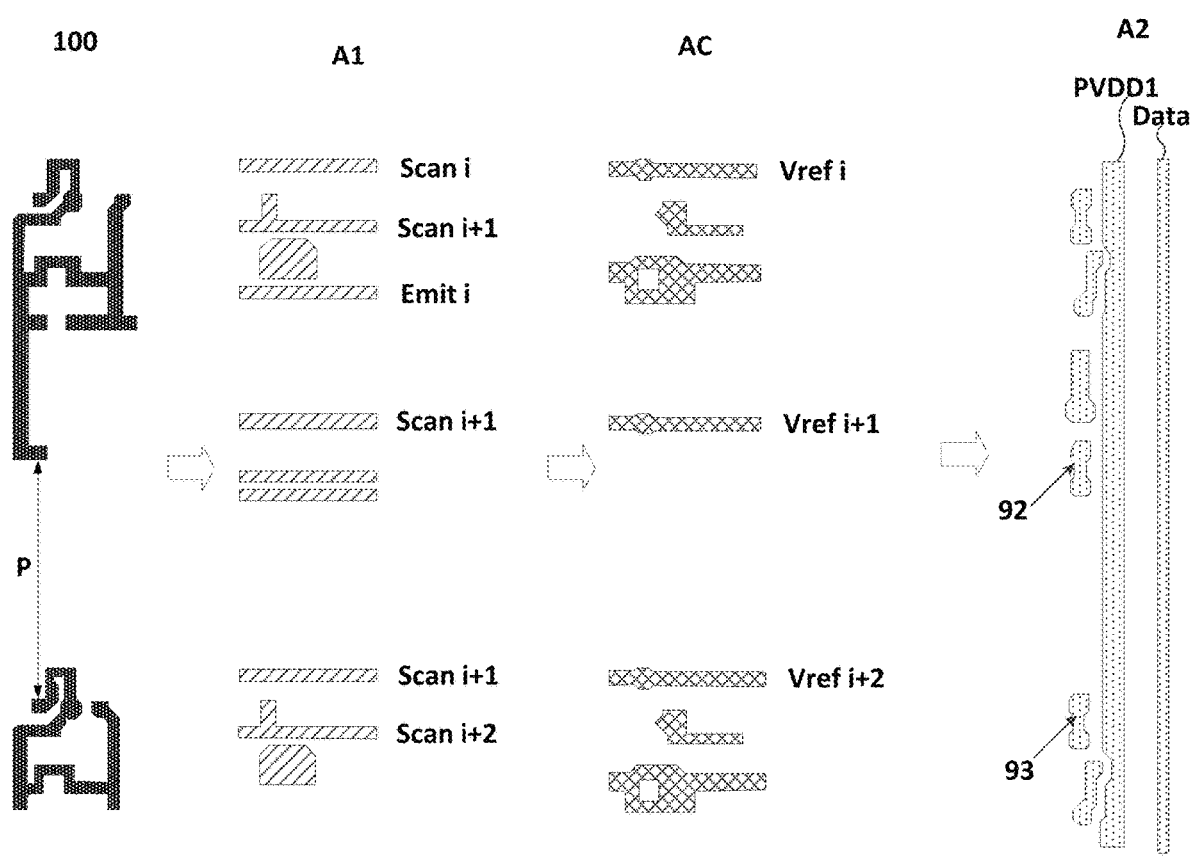
FIG. 14 illustrates layer-by-layer layouts of films of the pixel circuit in FIG. 12.

Optionally, the display panel includes a substrate and a reset signal line layer. The reset signal line layer is located on a side of the active layer facing away from the substrate. The reset signal line layer includes multiple reset signal lines. The active layer of the sub-pixel in the i-th row is electrically connected to one reset signal line at the discontinuity point through a second metal line. The active layer of the sub-pixel in the (i+1)-th row is electrically connected to one reset signal line at the discontinuity point through a third metal line. FIG. 11 is a layout diagram of a pixel circuit of another first display panel provided by an embodiment of the present disclosure. FIG. 12 is a layout diagram of a pixel circuit of another second display panel provided by an embodiment of the present disclosure. To show the layout structure of the pixel circuit more clearly, FIG. 13 illustrates layer-by-layer layouts of films of the pixel circuit in FIG. 11, and FIG. 14 illustrates layer-by-layer layouts of films of the pixel circuit in FIG. 12.

In FIGS. 11 and 12, in the same column, the active layers of the sub-pixel in the i-th row and the sub-pixel in the (i+1)-th row are provided with a discontinuity point between the second reset module (the sixth transistor M6) of the sub-pixel in the i-th row and the first reset module (the fifth transistor M5) of the sub-pixel in the (i+1)-th row, that is, the discontinuity point P between the first display area and the second display area are located between the second reset module of the sub-pixel in the i-th row and the first reset module of the sub-pixel in the (i+1)-th row.

Referring to FIGS. 11, 12, 13 and 14 concurrently, the reset signal line layer AC includes multiple reset signal lines Vref. The active layer of the sub-pixel in the i-th row is electrically connected to one reset signal line Vref at the discontinuity point P through a second metal line 92. The active layer of the sub-pixel in the (i+1)-th row is electrically connected to one reset signal line Vref at the discontinuity point P through a third metal line 93. Referring to FIG. 7, in the existing art, in the first display area, the active layer of the second reset module (the sixth transistor M6) of the sub-pixel in the i-th row is provided to be continuous with the active layer of the first reset module (the fifth transistor M5) of the sub-pixel in the (i+1)-th row, and one reset signal line is electrically connected between the active layer of the second reset module (the sixth transistor M6) of the sub-pixel in the i-th row and the active layer of the first reset module (the fifth transistor M5) of the sub-pixel in the (i+1)-th row to acquire a reset signal. In the embodiment of the present disclosure, in the same column, the active layers of the sub-pixel in the i-th row and the sub-pixel in the (i+1)-th row are provided with a discontinuity point between the second reset module (the sixth transistor M6) of the sub-pixel in the i-th row and the first reset module (the fifth transistor M5) of the sub-pixel in the (i+1)-th row, and thus the reset signal line needs to be electrically connected to the active layer of the second reset module (the sixth transistor M6) of the sub-pixel in the i-th row and the active layer of the first reset module (the fifth transistor M5) of the sub-pixel in the (i+1)-th row separately at the discontinuity point. As shown in FIGS. 11, 12, 13 and 14, the active layer of the second reset module (the sixth transistor M6) of the sub-pixel in the i-th row needs to be electrically connected to the reset signal line at the discontinuity point through the second metal line 92, and the active layer of the first reset module (the fifth transistor M5) of the sub-pixel in the (i+1)-th row needs to be electrically connected to the reset signal line at the discontinuity point through the third metal line 93.

Optionally, a first scanning line, a second scanning line, and a third scanning line are provided for sub-pixels in each row in the first display area and the second display area. A control end of the first reset module is electrically connected to the first scanning line. A control end of the data write module and a control end of the threshold compensation module are electrically connected to the second scanning line. A control end of the second reset module is electrically connected to the third scanning line. Comparing FIG. 7 with FIG. 11 and FIG. 6 with FIG. 12, if the discontinuity point is disposed between the second reset module of the sub-pixel in the i-th row and the first reset module of the sub-pixel in the (i+1)-th row in the same column, the sub-pixel in each row in the first display area and the second display area can be controlled by three scanning lines. For example, as shown in FIG. 11, the control end of the first reset module (the fifth transistor M5) of the sub-pixel in the i-th row is electrically connected to the first scanning line Scan i. The first reset module (the fifth transistor M5) is controlled by a scanning signal provided by the first scanning line Scan i to reset the control end of the drive transistor T. The control end of the data write module (the first transistor M1) and the control end of the threshold compensation module (the second transistor M2) are electrically connected to the second scanning line Scan (i+1). The data write module (the first transistor M1) and the threshold compensation module (the second transistor M2) are controlled by a scanning signal provided by the second scanning line Scan (i+1) to write data to the drive transistor T. The control end of the second reset module (the sixth transistor M6) is electrically connected to the third scanning line Scan (i+1). The second reset module (the sixth transistor M6) is controlled by a scanning signal provided by the third scanning line Scan (i+1) to reset the light emitting element. Referring to FIG. 11 and FIG. 12, the second reset module (the sixth transistor M6) of the sub-pixel in the i-th row may not need to share one scanning line with the first reset module (the fifth transistor M5) of the sub-pixel in the (i+1)-th row, and the sub-pixels in the two rows may be controlled independently.

Optionally, a scanning pulse signal received by the third scanning line is same as a scanning pulse signal received by the first scanning line or the second scanning line. That is, in the same row, a reset phase of the second reset module of the sub-pixel may be performed simultaneously with a reset phase of the first reset module of the sub-pixel, or in the same row, the reset phase of the second reset module of the sub-pixel may be performed simultaneously with a data write phase of the data write module and a compensation phase of the threshold compensation module of the sub-pixel, as long as the light emitting element is reset by the second reset module before the light emitting phase of the sub-pixel. In FIGS. 11 and 12, exemplarily, the scanning pulse signal received by the third scanning line and the scanning pulse signal received by the second scanning line are provided to be same, and thus both the second scanning line and the third scanning line are represented by Scan (i+1).

Optionally, in the first display area, the second reset module of the sub-pixel in the i-th row and the first reset module of the sub-pixel in the (i+1)-th row are electrically connected to the same reset signal line at the discontinuity point. Since the sub-pixels in the first display area are closely arranged, for example, as shown in FIG. 11, the second reset module (the sixth transistor M6) of the sub-pixel in the i-th and the first reset module (the fifth transistor M5) of the sub-pixel in the (i+1)-th row are provided to be electrically connected to the same reset signal lines at the discontinuity point. Such configuration can reduce the number of signal lines in the display panel.

Optionally, in the second display area, a first reset signal line and a second reset signal line are provided for the sub-pixel in each row; an input end of the first reset module is electrically connected to the first reset signal line; and an input end of the second reset module is electrically connected to the second reset signal line. For example, referring to FIG. 12, the sub-pixel in each row is correspondingly provided with two reset signal lines, and the sub-pixel in the i-th row is provided with a first reset signal line Vref i and a second reset signal line Vref (i+1) in the i-th row. The input end of the first reset module (the fifth transistor M5) of the sub-pixel in the i-th row is electrically connected to the first reset signal line Vref i. The input end of the second reset module (the sixth transistor M6) of the sub-pixel in the i-th row is electrically connected to the second reset signal line Vref (i+1). Since the second display area needs to be provided with a photosensitive element, comparing with the sub-pixels in the first display area, the sub-pixels in the second display area are sparsely arranged to enable more ambient light to be transmitted to the photosensitive element (such as a camera) in the second display area. If the sub-pixels in two adjacent rows still share the same reset signal line, since a distance between the sub-pixels in the two adjacent rows is relatively large, a longer connection line needs to be provided to enable the same reset signal line to provide the reset signal for the sub-pixels in the two adjacent rows. However, the longer connection line may increase the line resistance, and occupy a light-transmissive area between the sub-pixels in the two adjacent rows, which reduces the external ambient light transmitted to the photosensitive element and thus affects the working effect of the photosensitive element. According to the embodiment of the present disclosure, in the second display area, the sub-pixel in each row is provided with both the first reset signal line and the second reset signal line, where the first reset module of the sub-pixel in each row acquires the reset signal through the first reset signal line, and the second reset module of the sub-pixel in each row acquires the reset signal through the second reset signal line, thereby avoiding affecting the working effect of the photosensitive element in the second display area due to that the sub-pixels in the two adjacent rows share the reset signal line.

Optionally, the display panel further includes a second metal layer. The second metal layer is located on a side of the reset signal line layer facing away from the substrate. An insulating layer is disposed between the reset signal line layer and the second metal layer. The second metal layer includes multiple data lines, a second metal line, and a third metal line. Referring to FIGS. 13 and 14, the display panel includes a first metal layer A1 for forming a scan line Scan and a light emission control signal line Emit of the display panel. Optionally, the display panel further includes a second metal layer A2. The second metal layer A2 is located on a side of the reset signal line layer AC facing away from the substrate. An insulating layer is disposed between the reset signal line layer AC and the second metal layer A2 to achieve electrical insulation. The second metal layer A2 includes multiple data lines Data, the second metal line 92, and the third metal line 93. In the embodiment of the present disclosure, the second metal layer A2 is used to prepare the data line Data, the second metal line 92, and the third metal line 93 simultaneously. The active layer of the second reset module (the sixth transistor M6) of the sub-pixel in the i-th row is electrically connected to the reset signal line Vref at the discontinuity point through the second metal line 92, and the active layer of the first reset module (the fifth transistor M5) of the sub-pixel in the (i+1)-th row is electrically connected to the reset signal line Vref at the discontinuity point through the third metal line 93. There is no need to provide an additional metal film for the second metal line 92 and the third metal line 93, so that the number of the processes can be reduced.

Optionally, the display panel further includes a second metal layer and a third metal layer. The second metal layer is located on a side of the reset signal line layer facing away from the substrate. The third metal layer is located on a side of the second metal layer facing away from the substrate. An insulating layer is disposed between the second metal layer and the third metal layer. The second metal layer includes multiple data lines and multiple first positive power supply signal lines. The third metal layer includes multiple second positive power supply signal lines, the second metal line and the third metal line. The multiple second positive power supply signal lines are electrically connected to the multiple first positive power supply signal lines.

The second metal layer includes multiple data lines and multiple first positive power supply signal lines. The third metal layer includes multiple second positive power supply signal lines, the second metal line and the third metal line. The multiple second positive power supply signal lines are electrically connected to the multiple first positive power supply signal lines. That is, in a direction facing away from the substrate, the display panel is sequentially provided with the active layer, the first metal layer, the second metal layer, the insulating layer and the third metal layer.

The first positive power supply signal line is used for providing a positive power supply signal for the pixel circuit, and the data line is used for providing a data signal for the pixel circuit. The third metal layer includes multiple second positive power signal lines, the second metal line and the third metal line. Since it is necessary to supply a positive power supply signal to the pixel circuit of each sub-pixel in the display panel, but the first positive power signal line has a line resistance, it is possible that there is a difference among positive power supply signals received by the sub-pixels at different positions, thereby affecting the display effect. Therefore, in the display panel in the embodiment of the present disclosure, the second positive power supply signal lines are formed through the third metal layer, and are also used for supplying positive power supply signals to the pixel circuit. The second positive power supply signal lines and the first positive power supply signals are equivalently connected in parallel so that when the positive power supply signal is supplied to the pixel circuit, the line resistance can be reduced to a certain extent. In the embodiment of the present disclosure, the second positive power supply signal lines, the second metal line and the third metal line are formed through the third metal layer in a same process, without configuring an additional metal film for the second metal line and the third metal line, so that the number of processes can also be reduced.

Figure 15:
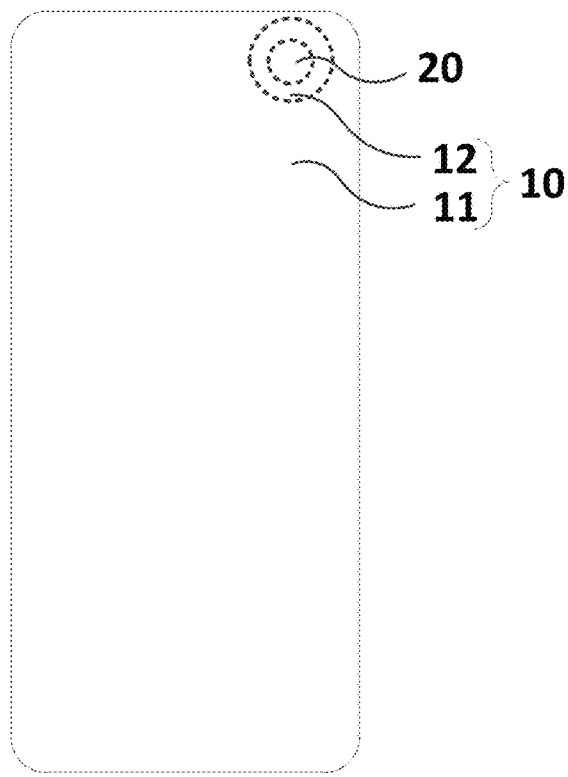
FIG. 15 is a structural diagram of another display panel provided by an embodiment of the present disclosure.

Optionally, based on the above embodiments, the first display area of the display panel provided by the embodiment of the present disclosure may include a first area and a second area, and the second area is located between the first area and the second display area. A sub-pixel arrangement density in the first area is greater than a sub-pixel arrangement density in the second area; and the sub-pixel arrangement density in the second area is greater than a sub-pixel arrangement density in the second display area. FIG. 15 is a structural view of another display panel provided by an embodiment of the present disclosure. As shown in FIG. 15, a first display area 10 of the display panel provided by the embodiment of the present disclosure includes a first area 11 and a second area 12. The second area 12 is located between the first area 11 and the second display area 20. A sub-pixel arrangement density in the first area 11 is greater than a sub-pixel arrangement density in the second area 12; and the sub-pixel arrangement density in the second area 12 is greater than a sub-pixel arrangement density in the second display area 20. Since the second display area 20 needs to be provided with a photosensitive element, the sub-pixel arrangement density in the second display area 20 is smaller than the sub-pixel arrangement density in the first display area 10 so that as much ambient light as possible is transmitted to the photosensitive element. To avoid a significant difference in display brightness or the like caused by the difference in the sub-pixel arrangement density in the first display area 10 and the second display area 20, in the embodiment of the present disclosure, the first display area 10 is divided into the first area 11 and the second area 12, and the sub-pixel arrangement density in the second area 12 is provided to be less than the sub-pixel arrangement density in the first area 11, and the sub-pixel arrangement density in the second area 12 is provided to be larger than the sub-pixel arrangement density in the second display area 20. That is, the second area 12 is equivalent to a transition area between the first area 11 and the second display area 20. The sub-pixel arrangement density in the second area 12 is between the sub-pixel arrangement density in the first area 11 and the sub-pixel arrangement density in the second display area 20, so that it is possible to avoid undesirable display effects such as a large display brightness difference caused by a large difference between the sub-pixel arrangement densities in the first display area and the second display area.

Based on the same concept described above, the embodiments of the present disclosure further provide a display device. The display device includes the display panel described in any embodiment of the present disclosure. Therefore, the display device provided by this embodiment of the present disclosure has the corresponding beneficial effects of the display panel provided by the embodiments of the present disclosure, which is not repeated here. Exemplarily, the display device may be a mobile phone, a computer, a smart wearable device (for example, a smart watch), an onboard display device, and other electronic devices, which is not limited by the embodiments of the present disclosure.

Figure 16:
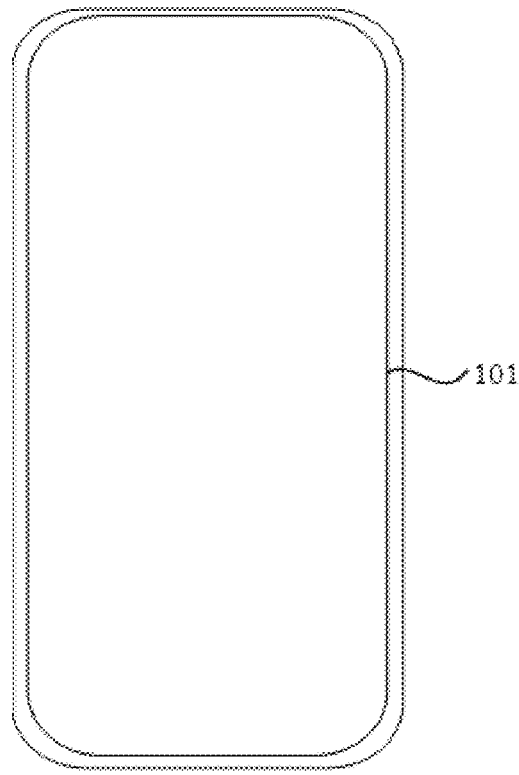
FIG. 16 is a structural diagram of a display device provided by an embodiment of the present disclosure.

Exemplarily, FIG. 16 is a structural view of a display device provided by an embodiment of the present disclosure. As shown in FIG. 16, the display device includes the display panel 101 in the embodiments described above.

It is to be noted that the preceding are merely preferred embodiments of the present disclosure and the technical principles used therein. It is to be understood by those skilled in the art that the present disclosure is not limited to the embodiments described herein. Those skilled in the art can make various apparent modifications, adaptations, and substitutions without departing from the scope of the present disclosure. Therefore, while the present disclosure has been described in detail via the preceding embodiments, the present disclosure is not limited to the preceding embodiments and may include equivalent embodiments without departing from the concept of the present disclosure. The scope of the present disclosure is determined by the scope of the appended claims.

What is claimed is:

1. A display panel, comprising:
a first display area and a second display area, wherein the first display area at least partially surrounds the second display area, and the second display area comprises a photosensitive element,
wherein each of the first display area and the second display area comprises a plurality of sub-pixels each comprising a pixel circuit and a light emitting element;
wherein the pixel circuit further comprises a drive transistor, a data write module, a threshold compensation module, a light emission control module, and a first reset module;
wherein the data write module is configured to provide a data signal to the drive transistor; and the light emission control module is connected in series to the drive transistor and the light emitting element separately and is configured to control whether a drive current flows through the light emitting element; wherein the threshold compensation mode is configured to detect and self-compensate an offset of a threshold voltage of the drive transistor; wherein the first reset module is connected to a control end of the drive transistor and is configured to reset the control end of the drive transistor;
wherein in the first display area and the second display area, active layers of pixel circuits in each column have discontinuity points; and
at least one of:
wherein in the first display area, a discontinuity point of one of the active layers is arranged between the threshold compensation module and the light emission control module; or
wherein in the second display area, a discontinuity point of one of the active layers is arranged between the threshold compensation module and the light emission control module.

2. The display panel of claim 1, further comprising at least one of:
wherein in the first display area, in response to the discontinuity point of one of the active layers is arranged between the threshold compensation module and the light emission control module, the threshold compensation module is electrically connected to the light emission control module through a metal line; or
wherein in the second display area, in response to the discontinuity point of one of the active layers is arranged between the threshold compensation module and the light emission control module, the threshold compensation module is electrically connected to the light emission control module through a first metal line.

3. The display panel of claim 1, further comprising: a substrate, a positive power supply signal line, and a data line;
wherein in the second display area, a first end of an active layer of each pixel circuit is electrically connected to the positive power supply signal line; and
wherein in the second display area, a second end of the active layer of each pixel circuit has an orthographic projection on a surface of the substrate, the data line has an orthographic projection of on the surface of the substrate, and the orthographic projection of the second end overlaps with the orthographic projection of the data line.

4. The display panel of claim 1, wherein positions of the discontinuity points in the first display area are same as positions of the discontinuity points in the second display area.

5. The display panel of claim 1, wherein each of the active layers is made of a polysilicon material.

6. The display panel of claim 1, wherein the pixel circuit further comprises a second reset module; and wherein the second reset module is electrically connected to the light emitting element and is configured to reset the light emitting element.

7. The display panel of claim 6, wherein a distance between each of the discontinuity points and a respective drive transistor is greater than 5 um.

8. The display panel of claim 6, wherein an active layer of each of the plurality of sub-pixels comprises a discontinuity point between the associated second reset module and the associated light emission control module; and wherein an active layer of the second reset module is electrically connected to an active layer of the light emission control module through a first metal line.

9. The display panel of claim 8, further comprising a substrate and a reset signal line layer, wherein the reset signal line layer is located on a side of the active layer facing away from the substrate; wherein the reset signal line layer comprises a plurality of reset signal lines; and wherein a second reset module of each of the plurality of sub-pixels in an i-th row and a first reset module of an associated one of the plurality of sub-pixels in an (i+1)-th row are electrically connected to a same one of the plurality of reset signal lines, wherein i is a positive integer.

10. The display panel of claim 9, further comprising a second metal layer, wherein the second metal layer is located on a side of the reset signal line layer facing away from the substrate; wherein an insulating layer is disposed between the reset signal line layer and the second metal layer; and wherein the second metal layer comprises a plurality of data lines and the first metal line.

11. The display panel of claim 9, further comprising a second metal layer and a third metal layer, wherein the second metal layer is located on a side of the reset signal line layer facing away from the substrate; wherein the third metal layer is located on a side of the second metal layer facing away from the substrate; wherein an insulating layer is disposed between the second metal layer and the third metal layer; wherein the second metal layer comprises a plurality of data lines and a plurality of first positive power supply signal lines; wherein the third metal layer comprises a plurality of second positive power supply signal lines and the first metal line; and wherein the plurality of second positive power supply signal lines are electrically connected to the plurality of first positive power supply signal lines.

12. The display panel of claim 6, wherein the data write module comprises a first transistor; wherein a first end of the first transistor is electrically connected to a data line; wherein a second end of the first transistor is electrically connected to a first end of the drive transistor;
  wherein the threshold compensation module comprises a second transistor, wherein a first end of the second transistor is electrically connected to a second end of the drive transistor; and wherein a second end of the second transistor is electrically connected to the control end of the drive transistor;
  wherein the light emission control module comprises a third transistor and a fourth transistor; wherein a first end of the third transistor is electrically connected to a first positive power supply signal line; wherein a second end of the third transistor is electrically connected to the first end of the drive transistor; wherein a first end of the fourth transistor is electrically connected to the second end of the drive transistor; wherein a second end of the fourth transistor is electrically connected to the light emitting element;
  wherein the first reset module comprises a fifth transistor, wherein a first end of the fifth transistor is electrically connected to a reset signal line, and wherein a second end of the fifth transistor is electrically connected to the control end of the drive transistor; and
  wherein the second reset module comprises a sixth transistor, wherein a first end of the sixth transistor is electrically connected to the reset signal line, and wherein a second end of the sixth transistor is electrically connected to the control end of the light emitting element.

13. The display panel of claim 1, wherein the first display area comprises a first area and a second area, wherein the second area is located between the first area and the second display area;
  wherein a sub-pixel arrangement density in the first area is greater than a sub-pixel arrangement density in the second area; and
  wherein the sub-pixel arrangement density in the second area is greater than a sub-pixel arrangement density in the second display area.

14. The display panel of claim 1, wherein the discontinuity point in each column is located either between a pair of associated adjacent sub-pixels in the column, or within an associated one of the plurality of sub-pixels in the column.

15. A display device, comprising a display panel, wherein the display panel comprises:
  a first display area and a second display area, wherein the first display area at least partially surrounds the second display area, and the second display area comprises a photosensitive element,
  wherein each of the first display area and the second display area comprises a plurality of sub-pixels each comprising a pixel circuit and a light emitting element;
  wherein the pixel circuit further comprises a drive transistor, a data write module, a threshold compensation module, a light emission control module, and a first reset module;
  wherein the data write module is configured to provide a data signal to the drive transistor; and the light emission control module is connected in series to the drive transistor and the light emitting element separately and is configured to control whether a drive current flows through the light emitting element; wherein the threshold compensation mode is configured to detect and self-compensate an offset of a threshold voltage of the drive transistor; wherein the first reset module is connected to a control end of the drive transistor and is configured to reset the control end of the drive transistor;
  in the first display area and the second display area, active layers of pixel circuits in each column have discontinuity points; and
  at least one of:
  wherein in the first display area, a discontinuity point of one of the active layers is arranged between the threshold compensation module and the light emission control module; or
  wherein in the second display area, a discontinuity point of one of the active layers is arranged between the threshold compensation module and the light emission control module.

16. A display panel, comprising:
  a first display area and a second display area, wherein the first display area at least partially surrounds the second display area, and the second display area comprises a photosensitive element,
  wherein each of the first display area and the second display area comprises a plurality of sub-pixels each comprising a pixel circuit and a light emitting element;
  wherein the pixel circuit further comprises a drive transistor, a data write module, a threshold compensation module, a light emission control module, a first reset module, and a second reset module;
  wherein the data write module is configured to provide a data signal to the drive transistor; and the light emission control module is connected in series to the drive transistor and the light emitting element separately and is configured to control whether a drive current flows through the light emitting element; wherein the threshold compensation mode is configured to detect and self-compensate an offset of a threshold voltage of the drive transistor; wherein the first reset module is connected to a control end of the drive transistor and is configured to reset the control end of the drive transistor; wherein the second reset module is electrically connected to the light emitting element and is configured to reset the light emitting element;
  wherein in the first display area and the second display area, active layers of the pixel circuits in each column have discontinuity points; and
  at least one of:
  wherein in the first display area, a discontinuity point of one of the active layers is arranged between the first reset module and the second reset module; or
  wherein in the second display area, a discontinuity point of one of the active layers is arranged between the first reset module and the second reset module.

17. The display panel of claim 16, further comprising: a substrate, a positive power supply signal line, and a data line;
  wherein in the second display area, a first end of an active layer of each pixel circuit is electrically connected to the positive power supply signal line; and
  wherein in the second display area, a second end of the active layer of each pixel circuit has an orthographic projection on a surface of the substrate, the data line has an orthographic projection of on the surface of the substrate, and the orthographic projection of the second end overlaps with the orthographic projection of the data line.

18. The display panel of claim 16, wherein positions of the discontinuity points in the first display area are same as positions of the discontinuity points in the second display area.

19. The display panel of claim 16, wherein a distance between each of the discontinuity points and a respective drive transistor is greater than 5 um.

20. The display panel of claim 16, wherein active layers of one of the plurality of sub-pixels in an i-th row and one of the plurality of sub-pixels in an (i+1)-th row of a column includes discontinuity points between the second reset module of the one of the plurality of sub-pixels in the i-th row and the first reset module of the one of the plurality of sub-pixels the sub-pixel in the (i+1)-th row, wherein i is a positive integer.

21. The display panel of claim 20, further comprising a substrate and a reset signal line layer, wherein the reset signal line layer is located on a side of the active layer facing away from the substrate; wherein the reset signal line layer comprises a plurality of reset signal lines; and
wherein at the one of the discontinuity points, the active layer of the one of the plurality of sub-pixels in the i-th row is electrically connected to one of the plurality of reset signal lines through a second metal line, and wherein the active layer of the one of the plurality of sub-pixels in the (i+1)-th row is electrically connected to one of the plurality of reset signal lines through a third metal line.

22. The display panel of claim 21, wherein a first scanning line, a second scanning line and a third scanning line are provided for a sub-pixel in each row in the first display area and the second display area; and
wherein a control end of the first reset module is electrically connected to the first scanning line; wherein a control end of the data write module and a control end of the threshold compensation module are electrically connected to the second scanning line; and wherein a control end of the second reset module is electrically connected to the third scanning line.

23. The display panel of claim 22, wherein a scanning pulse signal received by the third scanning line is same as a scanning pulse signal received by the first scanning line or the second scanning line.

24. The display panel of claim 21, wherein in the first display area, the second reset module of the one of the plurality of sub-pixels in the i-th row and the first reset module of the one of the plurality of sub-pixels in the (i+1)-th row are electrically connected to a same one of the plurality of reset signal lines at the one of the discontinuity points.

25. The display panel of claim 20, wherein in the second display area, a first reset signal line and a second reset signal line are provided for a sub-pixel in each row; wherein an input end of the first reset module is electrically connected to the first reset signal line; and wherein an input end of the second reset module is electrically connected to the second reset signal line.

26. The display panel of claim 21, further comprising a second metal layer, wherein the second metal layer is located on a side of the reset signal line layer facing away from the substrate; wherein an insulating layer is provided between the reset signal line layer and the second metal layer; and wherein the second metal layer comprises a plurality of data lines, the second metal line and the third metal line.

27. The display panel of claim 21, further comprising a second metal layer and a third metal layer, wherein the second metal layer is located on a side of the reset signal line layer facing away from the substrate; wherein the third metal layer is located on a side of the second metal layer facing away from the substrate; wherein an insulating layer is disposed between the second metal layer and the third metal layer; wherein the second metal layer comprises a plurality of data lines and a plurality of first positive power supply signal lines; wherein the third metal layer comprises a plurality of second positive power supply signal lines, the second metal line and the third metal line; and wherein the plurality of second positive power supply signal lines are electrically connected to the plurality of first positive power supply signal lines.

28. The display panel of claim 16, wherein the data write module comprises a first transistor; wherein a first end of the first transistor is electrically connected to a data line; wherein a second end of the first transistor is electrically connected to a first end of the drive transistor;
wherein the threshold compensation module comprises a second transistor, wherein a first end of the second transistor is electrically connected to a second end of the drive transistor; and wherein a second end of the second transistor is electrically connected to the control end of the drive transistor;
wherein the light emission control module comprises a third transistor and a fourth transistor; wherein a first end of the third transistor is electrically connected to a first positive power supply signal line; wherein a second end of the third transistor is electrically connected to the first end of the drive transistor; wherein a first end of the fourth transistor is electrically connected to the second end of the drive transistor; wherein a second end of the fourth transistor is electrically connected to the light emitting element;
wherein the first reset module comprises a fifth transistor, wherein a first end of the fifth transistor is electrically connected to a reset signal line, and wherein a second end of the fifth transistor is electrically connected to the control end of the drive transistor; and
wherein the second reset module comprises a sixth transistor, wherein a first end of the sixth transistor is electrically connected to the reset signal line, and wherein a second end of the sixth transistor is electrically connected to the control end of the light emitting element.

29. The display panel of claim 16, wherein the first display area comprises a first area and a second area, wherein the second area is located between the first area and the second display area;
wherein a sub-pixel arrangement density in the first area is greater than a sub-pixel arrangement density in the second area; and
wherein the sub-pixel arrangement density in the second area is greater than a sub-pixel arrangement density in the second display area.

30. The display panel of claim 16, wherein the discontinuity point in each column is located either between a pair of associated adjacent sub-pixels in the column, or within an associated one of the plurality of sub-pixels in the column.

* * * * *